United States Patent
Lee et al.

(10) Patent No.: US 7,338,610 B2
(45) Date of Patent: Mar. 4, 2008

(54) ETCHING METHOD FOR MANUFACTURING SEMICONDUCTOR DEVICE

(75) Inventors: Won-Jun Lee, Seoul (KR); Byoung-Moon Yoon, Gyeonngi-do (KR); In-Seak Hwang, Gyeonngi-do (KR); Yong-Sun Ko, Gyeonngi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 403 days.

(21) Appl. No.: 10/763,356

(22) Filed: Jan. 23, 2004

(65) Prior Publication Data

US 2005/0064674 A1   Mar. 24, 2005

(30) Foreign Application Priority Data

Sep. 22, 2003   (KR) .................. 10-2003-0065533

(51) Int. Cl.
*H01L 21/302* (2006.01)
*H01L 21/461* (2006.01)

(52) U.S. Cl. .................. 216/13; 216/38; 216/57; 216/67; 216/79; 216/83; 216/99; 438/254; 438/397; 438/690; 438/704; 438/719; 438/745; 438/753; 438/756

(58) Field of Classification Search ............ None
See application file for complete search history.

(56) References Cited

U.S. PATENT DOCUMENTS

| | | | |
|---|---|---|---|
| 5,668,038 A * | 9/1997 | Huang et al. ............ 438/396 |
| 5,895,250 A * | 4/1999 | Wu ........................ 438/396 |
| 6,162,681 A * | 12/2000 | Wu ........................ 438/256 |
| 6,383,867 B1 * | 5/2002 | Kim et al. ................ 438/253 |
| 6,531,358 B1 * | 3/2003 | Yu .......................... 438/253 |
| 6,653,199 B2 * | 11/2003 | Zheng .................... 438/398 |
| 6,656,790 B2 * | 12/2003 | Jang et al. .............. 438/253 |
| 6,911,364 B2 * | 6/2005 | Oh et al. ................. 438/253 |
| 2003/0104638 A1 * | 6/2003 | Kim et al. .................. 438/3 |
| 2004/0219748 A1 * | 11/2004 | Shimizu et al. .......... 438/253 |

FOREIGN PATENT DOCUMENTS

| | | |
|---|---|---|
| DE | 4307725 | 9/1993 |
| DE | 4412086 | 10/1994 |
| EP | 0595360 A1 | 5/1994 |
| KR | 2002-0083263 | 11/2002 |
| KR | 2002-0090452 | 12/2002 |

OTHER PUBLICATIONS

English language abstract of Korean Publication No. 2002-0083263.
English language abstract of Korean Publication No. 2002-0090452.
English language abstract of German Publication No. DE4307725.
English language abstract of German Publication No. DE4412086.

* cited by examiner

*Primary Examiner*—Anita K Alanko
(74) *Attorney, Agent, or Firm*—Marger Johnson & McCollom, P.C.

(57) ABSTRACT

A wafer having a dielectric layer and an electrode partially protruding from the top surface of the dielectric layer is provided. The dielectric layer is etched with a chemical solution such as LAL. Prior to etching, the protruding portion of the electrode is removed or reduced to prevent any bubbles included in the chemical solution from adhering to the electrode. Thus, the chemical solution can etch the dielectric layers without being blocked by any bubbles included in a chemical solution.

22 Claims, 5 Drawing Sheets

ETCHING METHOD FOR MANUFACTURING SEMICONDUCTOR DEVICE

CROSS REFERENCE TO RELATED APPLICATIONS

This application claims priority from Korean Patent Application No. 2003-65533, filed on Sep. 22, 2003, the contents of which are incorporated herein by reference in their entirety.

BACKGROUND OF THE INVENTION

1. Field of the Invention

The present invention relates to methods for manufacturing semiconductor devices. More particularly, the present invention relates to etching methods for manufacturing a semiconductor device such as a capacitor lower electrode.

2. Description of the Related Art

In fabricating semiconductor devices such as dynamic random access memory (DRAM) devices, a chemical solution such as one containing HF and $NH_4F$ ("LAL") or a buffer oxide etchant ("BOE") is commonly used to etch dielectric layers during various phases of semiconductor fabrication processes.

Unfortunately, air bubbles of various sizes included in the chemical solution often adhere to the surface of a semiconductor substrate, creating serious problems such as an oxide un-etch or not-open phenomenon. As the design rule decreases, this issue becomes more critical, considerably reducing the yield.

Accordingly, an immediate need exists for a novel etching method that can overcome problems caused by air bubbles contained in the chemical solution.

SUMMARY OF THE INVENTION

The present invention provides improved methods of etching dielectric layers using a chemical solution such as LAL without, for example, an un-etch or not-open phenomenon resulting from any bubbles contained in the chemical solution.

According to one embodiment of the present invention, a wafer having a dielectric layer and an electrode partially protruding from the top surface of the dielectric layer is provided. The dielectric layer is etched with a chemical solution. Prior to etching, the protruding portion of the electrode is removed or reduced. Preferably, the protruding portion of the electrode is removed or reduced sufficiently to prevent any bubbles included in the chemical solution from adhering to the electrode.

According to another embodiment of the present invention, an etching method comprises forming a first dielectric layer on a semiconductor substrate; forming an opening in the dielectric layer; depositing a conductive layer on the dielectric layer including the opening; depositing a second dielectric layer overlying the conductive layer within the opening; planarizing the resulting structure including the conductive layer, until the top surface of the first and second dielectric layers are exposed, to form a capacitor lower electrode; and etching the first and second dielectric layers with a chemical solution. Prior to etching, a top end portion of the electrode is reduced.

As a result of the inventive principles disclosed herein, bubbles contained in a chemical solution can be prevented from adhering to, for example, a capacitor lower electrode during dielectric layer etching processes. Thus, the chemical solution such as LAL can etch the dielectric layers without being blocked by any bubbles included in a chemical solution. Therefore, with the embodiments of the present invention, device failures, such as one bit failure caused by an un-etched phenomenon, can be prevented to increase the yield.

BRIEF DESCRIPTION OF THE DRAWINGS

The objects and advantages of the present invention will become more apparent by describing in detail preferred embodiments thereof with reference to the attached drawings in which.

DETAILED DESCRIPTION OF THE INVENTION

Figure 1A:
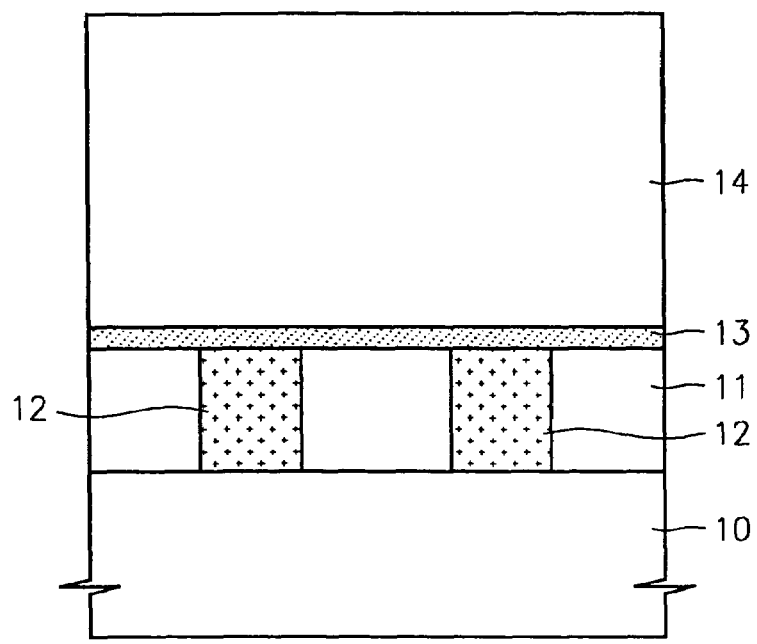
FIGS. 1A through 1G are cross-sectional views illustrating an etching method according to an embodiment of the present invention.

The present invention will now be described more fully with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete and will fully convey the concept of the invention to those skilled in the art. In the drawings, the shape of elements is exaggerated for clarity, and the same reference numerals in different drawings represent the same element.

Referring to FIG. 1A, to form a capacitor of a semiconductor device such as dynamic random access memories (DRAMs), an interlayer insulating layer or a pre-metal dielectric layer 11 is formed on a wafer or semiconductor substrate 10. The interlayer insulating layer 11 is formed of a dielectric material such as oxide.

Although not shown, a lower structure such as source/drain regions and gate electrodes are formed on the semiconductor substrate 10 to form a transistor or a memory cell. Then, a storage node contact pad 12 is formed in the interlayer dielectric layer 11 to be electrically connected to a capacitor lower electrode to be formed thereon, using conventional techniques. The storage node contact pad 12 is also electrically connected to active regions of the semiconductor substrate 10.

Subsequently, the interlayer dielectric layer 11 is planarized. An etch stop layer 13 is then formed on the interlayer dielectric layer 11. The etch stop layer 13 has a high etch selectivity with respect to the first dielectric layer 14. These layers can be formed using conventional processes. The etch stop layer 13 can be formed of, for example, silicon nitride to a thickness between about 500 to 1,000 angstroms.

A first dielectric layer 14 is formed on the etch stop layer 13. The etch stop layer 13 serves as an end point during a subsequent etching lift-off process for removing the first dielectric layer 14, as well as second dielectric layer 16 to be formed thereon.

The first dielectric layer 14 is preferably formed of an oxide having a thickness between about 3,000 to 20,000 angstroms using a conventional technique such as a low pressure chemical vapor deposition (LPCVD) process. The first dielectric layer 14 can be a single layer of plasma-enhanced tetraethylorthosilicate (PE-TEOS) or a multilayer including the PE-TEOS layer.

Figure 1B:
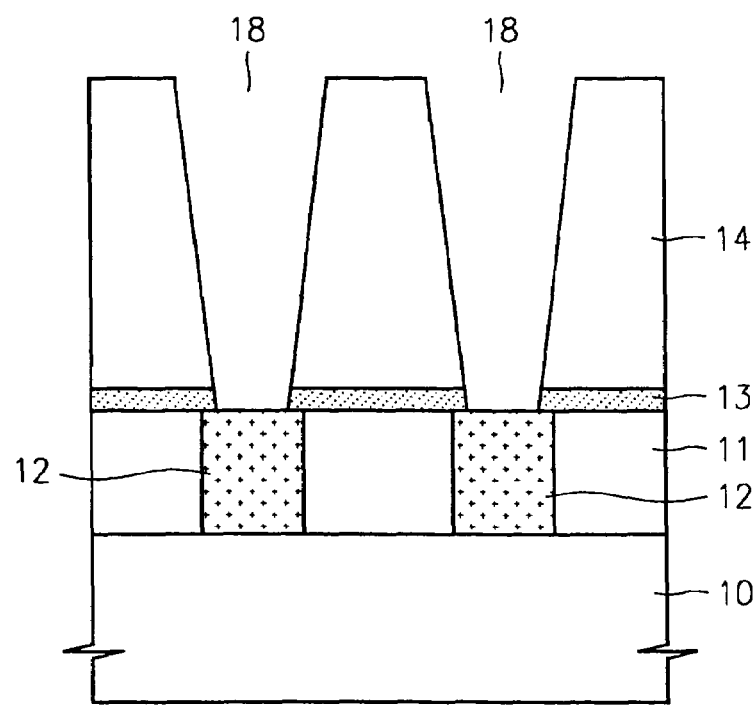

Referring to FIG. 1B, the first dielectric layer 14 is etched or patterned to form a storage node opening 18 therein to expose a portion of the contact pad 12, using conventional photolithography and etching processes, with the etch stop layer 13 as an etch stop. The etch stop layer 13 remaining within the storage node opening 18 is removed.

Figure 1C:
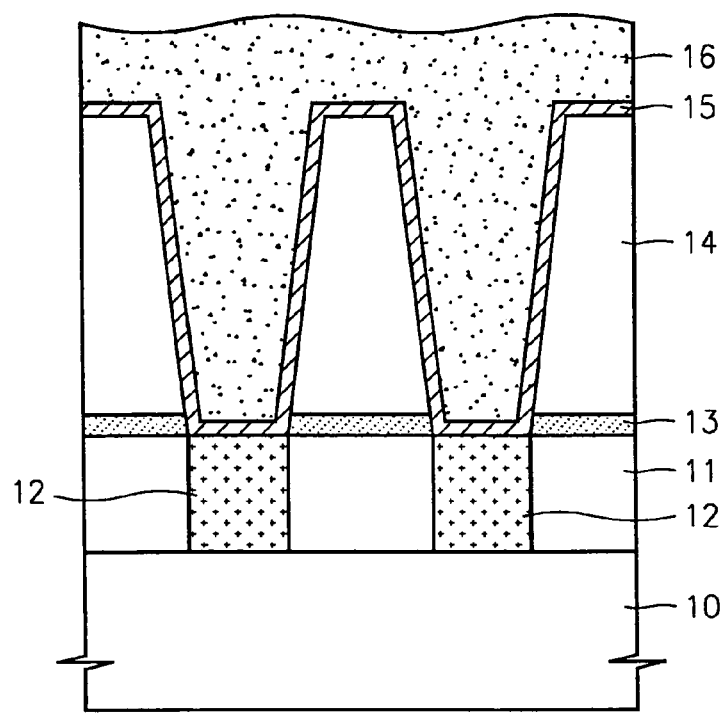

Referring to FIG. 1C, a conductive layer 15 formed of a material such as doped polysilicon, Pt, Ru, or TiN, is deposited on the first dielectric layer 14 including the opening 18 and on the storage node contact pad 12 to form a capacitor lower electrode 15'. (FIG. 1D) Then, a second dielectric layer 16 is formed on the conductive layer 15 that is connected to the contact pad 12 and within the opening 18. The second dielectric layer 16 is preferably formed of oxide to a thickness between about 10,000 to 30,000 angstroms. Those skilled in the art will appreciate that other suitable dielectric materials can also be used to form the first and second dielectric layers 14, 16.

Figure 1D:
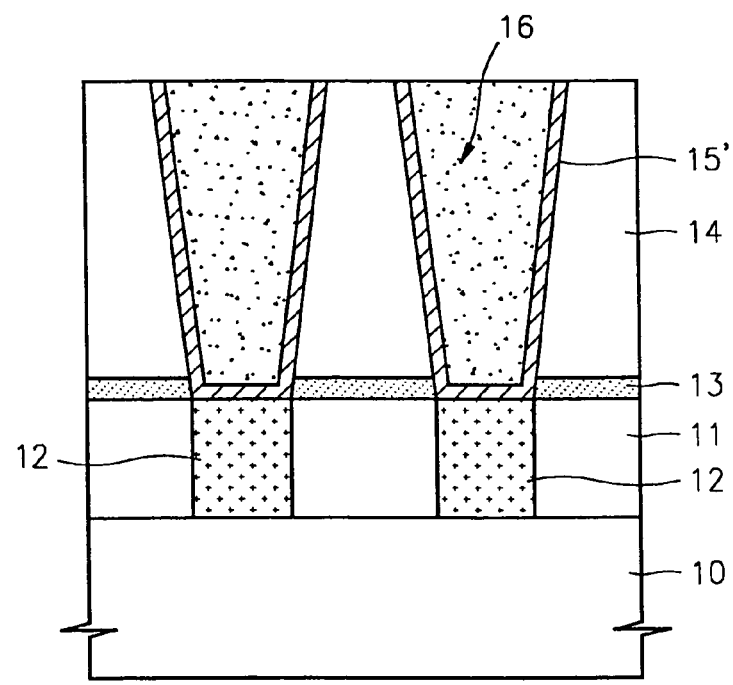

Turning to FIG. 1D, the first and second dielectric layers 14, 16 including the conductive layer 15 are planarized, until the top surface of the first and second dielectric layers 14, 16 are exposed, so as to form separated capacitor lower electrodes 15'.

The planarization process can be performed using conventional techniques such as chemical mechanical polishing (CMP) or an etching back process. Preferably, CMP comprises using a slurry having an etch selectivity between the capacitor lower electrode 15' and the first and second dielectric layers 14, 16. Preferably, etching back comprises using an etchant having an etch selectivity between the capacitor lower electrode 15' and the first and second dielectric layers 14, 16.

Figure 1E:
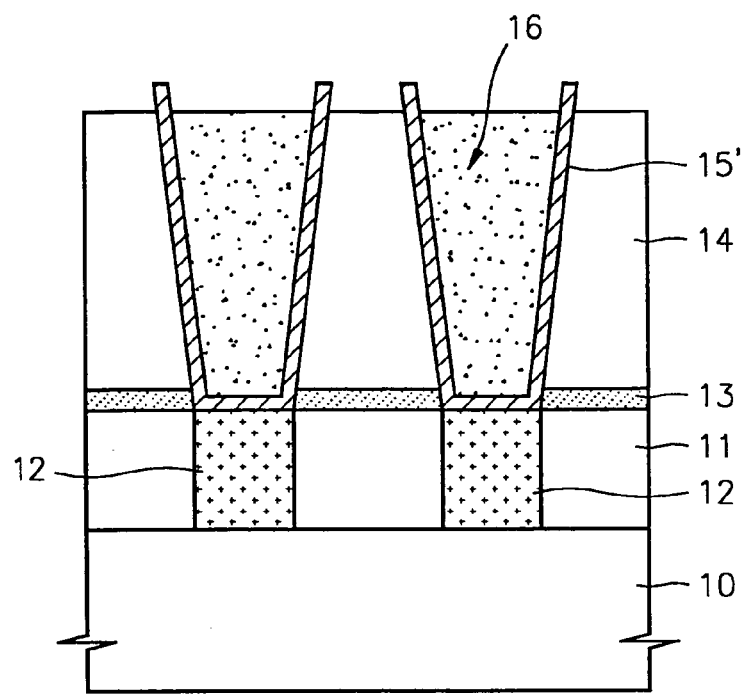

Referring to FIG. 1E, HF is preferably used to clean etching back or CMP residues resulting from the planarization process. An upper part of the capacitor lower electrode 15' having, for example, a circle or elliptical shape may protrude from the surface of dielectric layers 14, 16 because of this wet cleaning process using HF, which selectively etches dielectric layers such as an oxide while substantially leaving the capacitor lower electrode having exposed inner and outer surfaces formed of, for example, polysilicon. Other suitable chemicals can also be used to clean the residues as is known in the art.

Referring 1G, the first and second dielectric layers 14, 16 are preferably concurrently removed using a conventional lift-off process to complete the capacitor lower electrode 15'. In particular, the first and second dielectric layers 14, 16 are etched with a chemical solution such as LAL. During this wet etching process, LAL, the composition of which is disclosed in the Korean Patent Application 2003-65533, filed Sep. 22, 2003, from which the present application claims priority, is typically used. Other suitable wet etch chemicals besides LAL can be used as is known in the art.

Figure 2A:
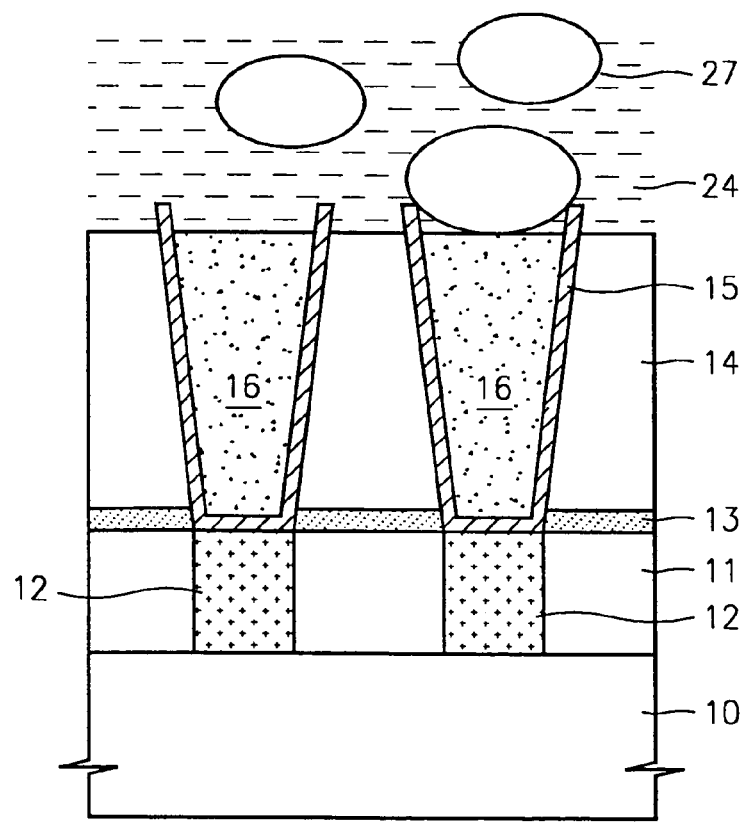
FIG. 2A is a cross-sectional view illustrating bubbles included in a chemical solution such as LAL being trapped in a circular capacitor lower electrode.

However, unfortunately, bubbles contained in the chemical solution such as LAL can easily adhere to the projected portion of the lower electrode 15' as shown in FIG. 2A. This is especially true if the lower electrode 15' is, for example, circular or elliptical in plan view because it can easily trap the bubbles.

Figure 2B:
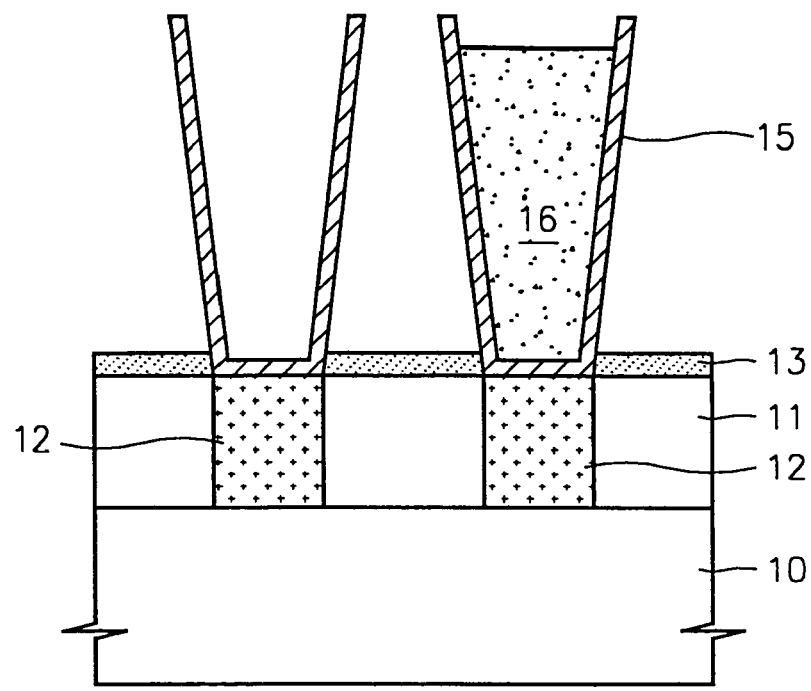
FIG. 2B is a cross-sectional view illustrating an unetched portion caused by the bubbles present in the chemical solution within the capacitor lower electrode.
Figure 2C:
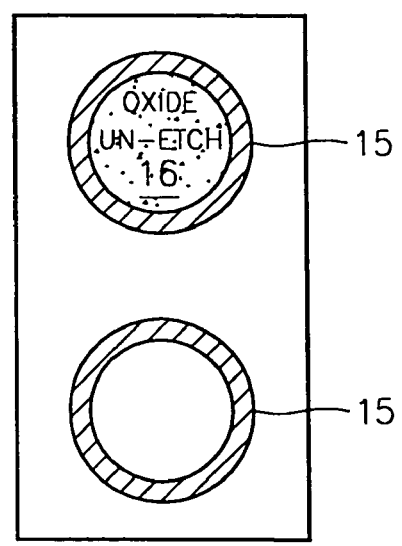
FIG. 2C is a top view of capacitor lower electrode structures of a semiconductor device illustrating a closed storage node contact of FIG. 2B, showing a "not open" phenomenon.

This issue becomes more critical, as the design rule further decreases, because these undesirable bubbles trapped in the capacitor lower electrode 15' prevent the chemical solution such as LAL from contacting the dielectric layer 16, thereby causing an un-etch or not open phenomenon, as shown in FIGS. 2B and 2C. In other words, a portion of the dielectric layers 16 is left unetched because of the bubbles present in the chemical solution, thus preventing the chemical solution from contacting the second dielectric layer 16. This in turn prevents removal of the second dielectric oxide layer 16.

Figure 1F:
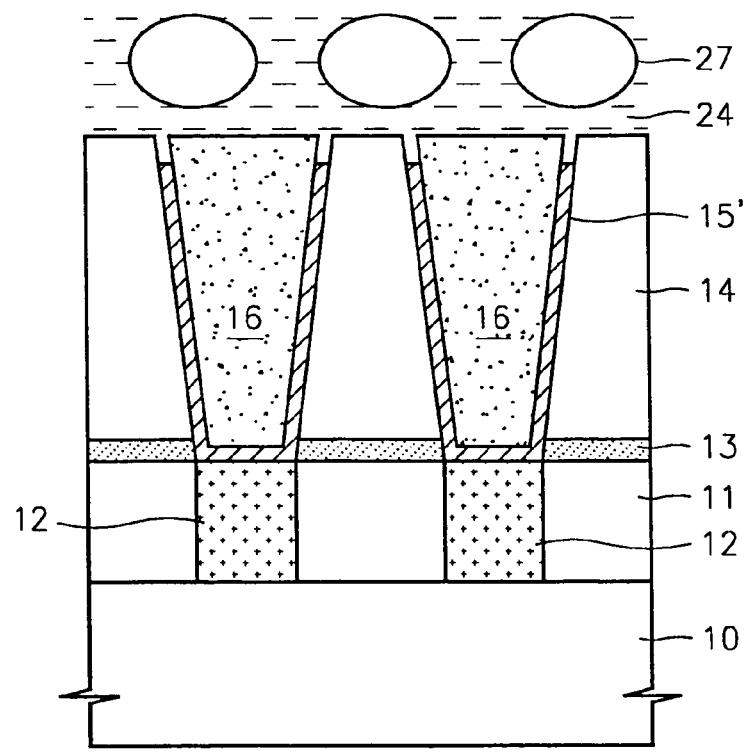
Figure 1G:
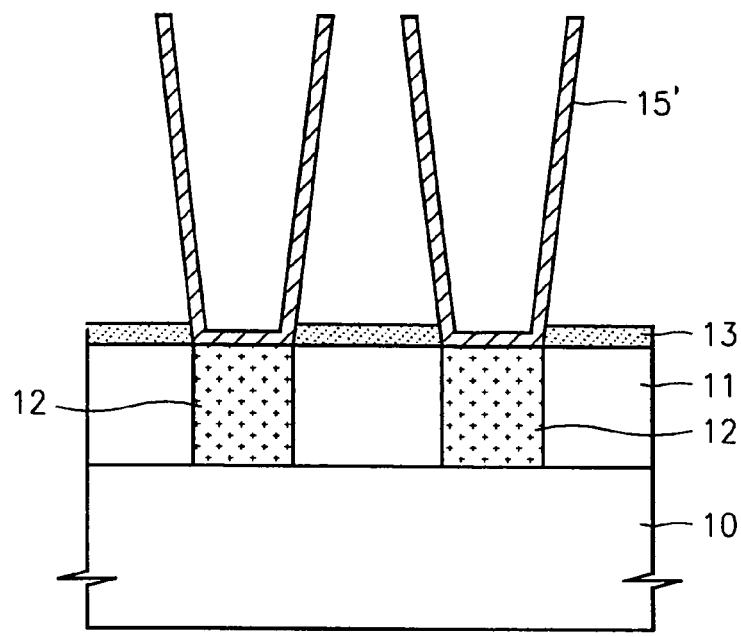

Now turning to FIG. 1F, to deal with the problem described above, according to an embodiment of the present invention, prior to performing a conventional lift-off process, i.e., wet etching to remove the first and second dielectric layers 14, 16, a top end portion of the capacitor lower electrode 15' is removed or reduced sufficiently to prevent any bubbles included in the chemical solution from adhering to the electrode 15' or the semiconductor substrate 10.

Preferably, the protruding portion is reduced to recess the top surface of the electrode 15' below the top surface of the dielectric layers 14, 16 at a depth sufficient enough to prevent any bubbles included in the chemical solution from adhering to the electrode 15' or the semiconductor substrate 10. Thus, the top surface of the electrode 15' is lower than the top surface of the first and second dielectric layers 14, 16. More preferably, the lowered (recessed) top surface is at least 500 angstroms below the top surface of the first dielectric layer 14.

Alternatively, the top portion of the capacitor lower electrode 15' is preferably reduced such that the top surface of the capacitor lower electrode 15' is substantially level with the top surface of the first dielectric layer 14.

However, one skilled in the art will appreciate that the present invention is not limited to the above-described embodiments. For example, the top surface of the lower electrode 15' may be slightly above the top surface of the first dielectric layer 14 as long as any bubbles included in the chemical solution can be prevented from adhering to the electrode 15' or to the semiconductor substrate 10 by reducing the top end portion of the capacitor lower electrode 15'.

According to another embodiment of the present invention, the protruding portion is reduced using dry etching. Preferably, the drying etching uses an etchant selected from the group consisting of $HB_4$, $Cl_2$, $CF_4$, $C_4F_8$, $C_5F_8$, $SF_6$, $O_2$, and combinations thereof. Alternatively, the protruding portion is reduced using wet etching. Preferably, wet etching uses a polysilicon etchant 24.

According to another aspect of the present invention, the top end portion of the electrode 15' may be reduced in situ while the etching back process is performed to planarize the first and second dielectric layers 14, 16, as described above with reference to FIG. 1D. This can be accomplished by, for example, increasing the poly etchant component.

Alternatively, the top end portion of the electrode 15' may be reduced in situ while the CMP is performed to planarize the first and second dielectric layers 14, 16, as described above with reference to FIG. 1D. For example, the CMP can be performed as two-step processes. In other words, a conventional CMP process is performed until the resulting structure is planarized. Then, the top end portion of the electrode 15' can be reduced by increasing the poly etchant component of the CMP slurry.

However, the present invention is not limited to the above described embodiments. One skilled in the art will appreciate that other suitable methods to reduce the top end portion of the electrode 15' can be equally applicable to the present invention.

As a result of the inventive principles disclosed herein, bubbles contained in a chemical solution can be prevented from adhering to, for example, a capacitor lower electrode during dielectric layer etching processes. Thus, the chemical solution such as LAL can etch the dielectric layers without being blocked by any bubbles included in a chemical solution.

Therefore, with the embodiments of the present invention, device failures, such as one bit failure caused by an un-etched phenomenon, can be prevented. Therefore, the yield can be significantly increased.

While the present invention has been particularly shown and described with reference to a method for manufacturing a capacitor, this invention should not be construed as being limited thereto. Rather, the present invention can be applied to any wet etching process involving a chemical solution containing bubbles therein to etch any dielectric structure, in which an electrode or a conductive layer partially protrudes from the top surface of the dielectric structure, without departing from the spirit and scope of the present invention as defined by the following claims.

What is claimed is:

1. An etching method comprising:
   providing a wafer having a dielectric layer and plurality of electrodes separated from each other;
   planarizing the electrodes and the dielectric layer such that top surfaces of the electrodes are coplanar with the top surface of the dielectric layer;
   after planarizing the electrodes and the dielectric layer, wet etching the wafer including the dielectric layer and separated electrodes such that at least one of the electrodes partially protrudes from the top surface of the dielectric layer and has exposed inner and outer surfaces;
   etching the dielectric layer with a chemical solution; and
   prior to etching the dielectric layer, reducing the protruding portion of the electrode, wherein reducing the protruding portion includes recessing a top surface of the electrode at least 500 angstroms below the top surface of the dielectric layer.

2. The method of claim 1, wherein the protruding portion of the electrode is reduced sufficiently to prevent any bubbles included in the chemical solution from adhering to the electrode.

3. The method of claim 1, wherein reducing the protruding portion comprises dry etching.

4. The method of claim 3, wherein drying etching uses an etchant selected from the group consisting of $HB_4$, $Cl_2$, $CF_4$, $C_4F_8$, $C_5F_8$, $SF_6$, $O_2$ and combinations thereof.

5. The method of claim 1, wherein reducing the protruding portion comprises wet etching.

6. The method of claim 5, wherein etching uses a polysilicon etchant.

7. The method of claim 1, wherein the dielectric layer includes an oxide.

8. A method of preventing bubbles from adhering to a substantially cylindrical electrode having a sidewall portion and a bottom portion during a dielectric layer etching process, the method comprising:
   providing a semiconductor substrate having the substantially cylindrical electrode, a first dielectric layer, and a second dielectric layer formed over the substrate, where the first dielectric layer surrounds the sidewall portion of the electrode and the second dielectric layer is formed in between the sidewall portion to cover the bottom portion of the electrode, and where an upper portion of the sidewall portion of the electrode protrudes above top surfaces of the first and second dielectric layers;
   etching the electrode to recess the upper portion of the electrode below the top surfaces of the first and second dielectric layers; and
   thereafter, etching the first and second dielectric layers in the dielectric layer etching process to expose substantially all of the sidewall portion of the electrode.

9. The method of claim 8, wherein the upper electrode is etched below the top surfaces of the first and second dielectric layers such that a recession having a width substantially equal to the width of the sidewall portion of the electrode is formed between the first and second dielectric layers.

10. The method of claim 8, wherein the top surface of the first dielectric layer is located at substantially the same height above the substrate as the top surface of the second dielectric layer.

11. The method claim 8, wherein the first and second dielectric layers include an oxide.

12. An etching method comprising:
    providing a wafer having a an electrode and a dielectric layer, where the dielectric layer is formed over a top surface of the electrode;
    planarizing the electrode and dielectric layer such that a top surface of the dielectric layer is coplanar with the top surface of the electrode thereafter;
    wet cleaning the top surfaces of the electrode and dielectric layer such that the top surface of the electrode protrudes from the top surface of the dielectric layer and has exposed inner and outer surfaces;
    etching the dielectric layer with a chemical solution; and
    prior to etching the dielectric layer, reducing the protruding portion of the electrode, wherein reducing the protruding portion includes recessing a top surface of the electrode below the top surface of the dielectric layer.

13. An etching method comprising:
    providing a wafer having a dielectric layer and an electrode including sidewalls having inner and outer surfaces, wherein a portion of the sidewalls partially protrudes from a top surface of the dielectric layer such that the inner and outer surfaces of the protruding portion of the sidewalls are exposed;
    etching the dielectric layer with a chemical solution; and
    prior to etching the dielectric layer, reducing the protruding portion of the electrode, wherein reducing the protruding portion includes recessing a top surface of the electrode below the top surface of the dielectric layer.

14. The method of claim 8, wherein etching the electrode comprises dry etching.

15. The method of claim 14, wherein drying etching uses an etchant selected from the group consisting of $HB_4$, $Cl_2$, $CF_4$, $C_4F_8$, $C_5F_8$, $SF_6$, $O_2$ and combinations thereof.

16. The method of claim 8, wherein etching the electrode comprises wet etching.

17. The method of claim 16, wherein wet etching uses a polysilicon etchant.

18. The method of claim 13, wherein etching the electrode comprises dry etching.

19. The method of claim 18, wherein drying etching uses an etchant selected from the group consisting of $HB_4$, $Cl_2$, $CF_4$, $C_4F_8$, $C_5F_8$, $SF_6$, $O_2$ and combinations thereof.

20. The method of claim 13, wherein etching the electrode comprises wet etching.

21. The method of claim 20, wherein wet etching uses a polysilicon etchant.

22. The method of claim 13, wherein the dielectric layer includes an oxide.

* * * * *

UNITED STATES PATENT AND TRADEMARK OFFICE
CERTIFICATE OF CORRECTION

PATENT NO. : 7,338,610 B2
APPLICATION NO. : 10/763356
DATED : March 4, 2008
INVENTOR(S) : Won-Jun Lee et al.

Page 1 of 1

It is certified that error appears in the above-identified patent and that said Letters Patent is hereby corrected as shown below:

Column 5, line 57, the words "wherein etching" should read -- wherein wet etching --;
Column 6, line 33, the words "electrode thereafter;" should read -- electrode, thereafter; --;

Signed and Sealed this

Second Day of September, 2008

JON W. DUDAS
*Director of the United States Patent and Trademark Office*